United States Patent [19]

Pfeiffer et al.

[11] 4,376,249

[45] Mar. 8, 1983

[54] VARIABLE AXIS ELECTRON BEAM PROJECTION SYSTEM

[75] Inventors: Hans C. Pfeiffer, Ridgefield, Conn.; Guenther O. Langner, Hopewell Junction; Maris A. Sturans, Bedford, both of N.Y.

[73] Assignee: International Business Machines Corporation, Armonk, N.Y.

[21] Appl. No.: 204,427

[22] Filed: Nov. 6, 1980

[51] Int. Cl.³ .............................................. H01J 3/20
[52] U.S. Cl. ............................. 250/396 ML; 250/398
[58] Field of Search ............. 250/396 ML, 398, 492.2, 250/396 R, 492.3

[56] References Cited

U.S. PATENT DOCUMENTS

| | | | |
|---|---|---|---|
| 2,494,442 | 1/1950 | LePoole. | |
| 3,597,609 | 8/1971 | Anger et al. | |
| 3,715,582 | 2/1973 | Akahori et al. | |
| 3,894,271 | 7/1975 | Pfeiffer et al. | 315/384 |
| 3,930,181 | 12/1975 | Pfeiffer | 313/421 |
| 3,984,687 | 10/1976 | Loeffler et al. | 250/396 ML |
| 4,000,440 | 12/1976 | Hall et al. | 315/383 |
| 4,112,305 | 9/1978 | Goto et al. | 250/492 R |
| 4,117,340 | 9/1978 | Goto et al. | 250/492.2 |
| 4,122,369 | 10/1978 | Hughes et al. | 313/430 |
| 4,199,688 | 4/1980 | Ozasa | 250/492.2 |
| 4,199,689 | 4/1980 | Takigawa | 250/492.2 |

OTHER PUBLICATIONS

H. C. Pfeiffer, "Recent Advances in Electron-Beam Lithography for the High-Volume Production of VLSI Devices", *IEEE Transactions on Electron Devices*, vol. ED-26, No. 4, Apr. 1979, pp. 663-674.
E. Munro, "Reducing Deflection Aberrations in Electron-Beam Scanning Systems", IBM Technical Disclosure Bulletin, vol. 17, No. 10, Mar. 1975, p. 3107.
H. Ohiwa, "Design of Electron-Beam Scanning Systems Using the Moving Objective Lens", *J. Vac. Sci. Technol.*, 15(3), May/Jun. 1978, pp. 849-852.
E. Goto et al., "MOL (Moving Objective Lens)", *OPTIK*, 1977, pp. 6-122/1-16.

Primary Examiner—Alfred E. Smith
Assistant Examiner—Carolyn E. Fields
Attorney, Agent, or Firm—John A. Jordan

[57] ABSTRACT

An electron beam projection system having a projection lens arranged so that upon pre-deflection of the electron beam the electron optical axis of the lens shifts to be coincident with the deflected beam. The projection system includes means for producing an electron beam, means for deflecting the beam, a magnetic projection lens having rotational symmetry for focusing the deflected beam and a pair of magnetic compensation yokes positioned within the bore of the projection lens means. The pair of correction yokes has coil dimensions such that, in combination, they produce a magnetic compensation field proportional to the first derivative of the axial magnetic field strength distribution curve of the projection lens. Upon application of current to the pair of compensation yokes the electron optical axis of the projection lens shifts to the position of the deflected beam so that the electron beam remains coincident with the shifted electron optical axis and lands perpendicular to a target.

14 Claims, 11 Drawing Figures

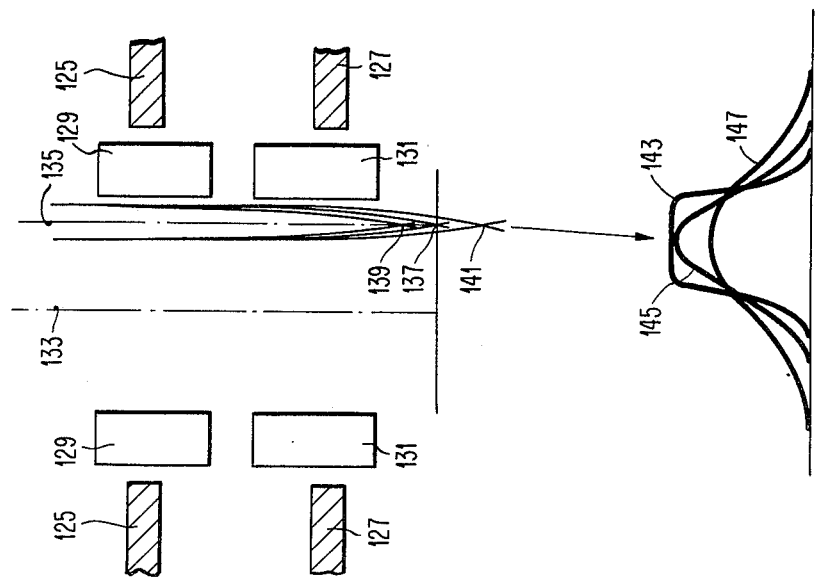
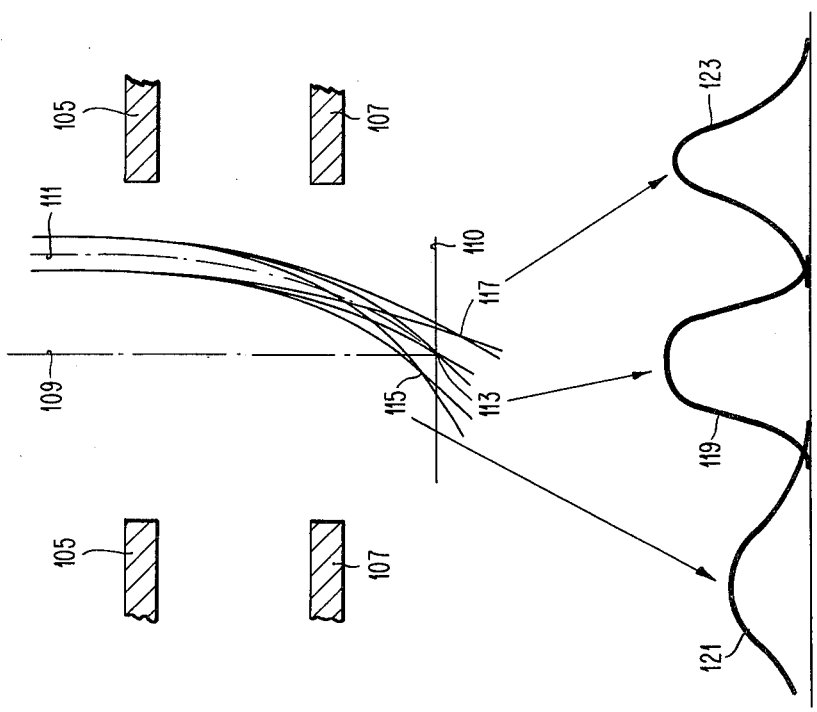

VARIABLE AXIS ELECTRON BEAM PROJECTION SYSTEM

BACKGROUND OF THE INVENTION

1. Field of the Invention

The present invention relates generally to the field of electron beam imaging and deflection systems. More particularly, the present invention relates to an arrangement of a magnetic lens relative to magnetic compensation fields whereby the electron optical axis is shifted so as to be coincident with a deflected electron beam at all times.

2. Description of the Prior Art

Deflection units in prior art electron beam columns are known to have three basic configurations which provide deflection before the electron beam lands on a target. In general, the prior art configurations provide deflection before the final lens, deflection after the final lens or deflection within the final lens. In all of these configurations, a basic problem is that the beam does not land perpendicular to the target and off-axis aberrations are encountered.

Deflection before the final lens has the advantage that a short focal length or working distance can be used. A short focal length is desirable to provide high resolution capability and reduction of on-axis aberrations. A high resolution capability is mandatory for scanning electron microscopy uses. The disadvantages of deflection before the final lens are that the deflection angle and all deflection aberrations increase rapidly with increasing field coverage thereby limiting the operation to relatively small fields of view. Deflection before the final lens requires double deflection using two deflection yokes. The deflected beam is transmitted through the magnetic lens in a direction which is inclined to the electron optical axis of the magnetic lens which results in off-axis aberrations. An example of deflection before the lens is shown in the publication "A Computer-Controlled Electron-Beam Machine for Micro-Circuit Fabrication" by T. H. P. Chang and B. A. Wallman, Record of 11th Symposium on Electron, Ion and Laser Beam Technology, San Francisco Press, Inc., at page 471.

Deflection after the final lens eliminates off-axis aberrations of the lens since the electron beam passes through the magnetic lens at the center of the lens prior to deflection. Deflection after the final lens results in a reduction of total deflection aberrations and permits a large field coverage. The disadvantage of deflection after the final lens is that a long focal length or working distance must be used which results in poor resolution because the use of a long focal length or working distance results in substantial on-axis aberrations. A further major disadvantage of deflection after the final lens is that the use of a long focal length or working distance necessitates a small opening angle of the beam which results in a very small beam current density in the target. The combination of poor resolution and small beam current is highly disadvantageous when the electron beam column is used to write patterns in semiconductor wafers having line widths less than about 1.5 micron.

U.S. Pat. No. 3,930,181 to H. C. Pfeiffer, assigned to the same assignee as the present application, describes an improved electron beam system wherein the electron beam magnetic deflection yoke is physically located inside the lens between the pole pieces of the final or projection magnetic lens of the electron beam column. The electron beam deflection apparatus of U.S. Pat. No. 3,930,181 is schematically illustrated in FIG. 2. The apparatus of the aforesaid patent is a compromise between the systems which use deflection before the lens and those which use deflection after the lens. The focal length or working distance of the lens can be chosen much shorter than that of the systems which use deflection after the final lens but not as short as with systems which use deflection before the final lens. The off-axis aberrations associated with deflection before the final lens are reduced in the aforesaid system as compared to the systems with deflection before the lens but are not as small as found in those systems which use deflection after the final lens. The beam current density is significantly improved over the systems using deflection after the final lens but the resolution is not as good as those systems which use deflection before the final lens.

Further, the electron beam does not land perpendicular to the target.

The present invention is distinct over the prior art in that the advantages of deflection before the final lens, after the final lens and within the final lens are combined in a single electron beam apparatus. The present invention utilizes deflection before the final lens which permits use of a short focal length or working distance but has the additional feature of being able to shift the electron optical axis of the final lens coincident with the deflected beam to eliminate off-axis aberrations associated with deflection before the final lens. The short focal length permits high resolution and high beam current. The movement of the electron optical axis permits large fields of view without the inherent disadvantages associated with deflection after the final lens.

The concept of providing a moving objective lens is disclosed in articles by H. Ohiwa, "Design of Electron-Beam Scanning Systems Using the Moving Objective Lens", J. Vac. Sci. Technol., 15 (3), May/June 1978, pp. 849–852 and E. Goto, "MOL (Moving Objective Lens)", Opik 48 (1977), pp. 255. In these articles some mathematical considerations for providing a moving objective lens are discussed. However, the articles do not suggest or disclose any working apparatus which could be used to provide a magnetic lens with a movable axis.

SUMMARY OF THE INVENTION

An object of the present invention is to provide an electron beam column having deflection before the final lens combined with means for shifting the electron optical axis of the final lens coincident with the deflected beam.

Another object of the present invention is to provide a variable axis lens for use in electron beam columns to eliminate off-axis aberrations.

Still another object of the present invention is to provide an electron beam column wherein dynamic corrections for focus and astigmatism are provided thereby eliminating the so-called third order aberrations associated with movement of the electron optical axis to a shifted position.

The foregoing and other objects, features and advantages of the invention will become more apparent from the following detailed description of a preferred embodiment of the invention, as illustrated in the accompanying drawings.

BRIEF DESCRIPTION OF THE DRAWINGS

FIG. 8A is a schematic cross-sectional view of a pole piece lens showing the path of an electron beam through the lens at various electron beam energies, entering the lens offset from the symmetry axis by a significant amount.

FIG. 8B is a schematic cross-sectional view of a pole piece lens with the compensation yokes of the invention showing the path of an electron beam through the lens at various electron beam energies, offset from the symmetry axis by the same amount as in FIG. 8A.

DETAILED DESCRIPTION OF THE INVENTION

The present invention relates to an electron beam column having a unique lens assembly whereby the electron optical axis of the lens can be shifted to be coincident with a deflected electron beam path. Electron beam columns generally consist of a vertical arrangement of separate stages including an electron beam source, a condensor lens, alignment stages, magnification lens stages, demagnification lens stages, a projection lens, a deflection unit and a target stage.

The lenses used in an electron beam column described herein are round magnetic pole piece lenses. It is well known that a magnetic field produced by ferromagnetic pole pieces with a circular bore focuses an electron beam entering the bore of a pole piece in the same manner as a spherical glass lens focuses light. A patent (German Patent DRP. No. 680,284) for a pole piece lens of a short focal length has been issued to B. V. Borries and E. Ruska on Mar. 17, 1932, assigned to Siemens A. G. A newer example of a magnetic lens is given in U.S. Pat. No. 3,659,097 to Richard Bassett et al. and assigned to National Research Development Corporation.

Figures 1, 2:
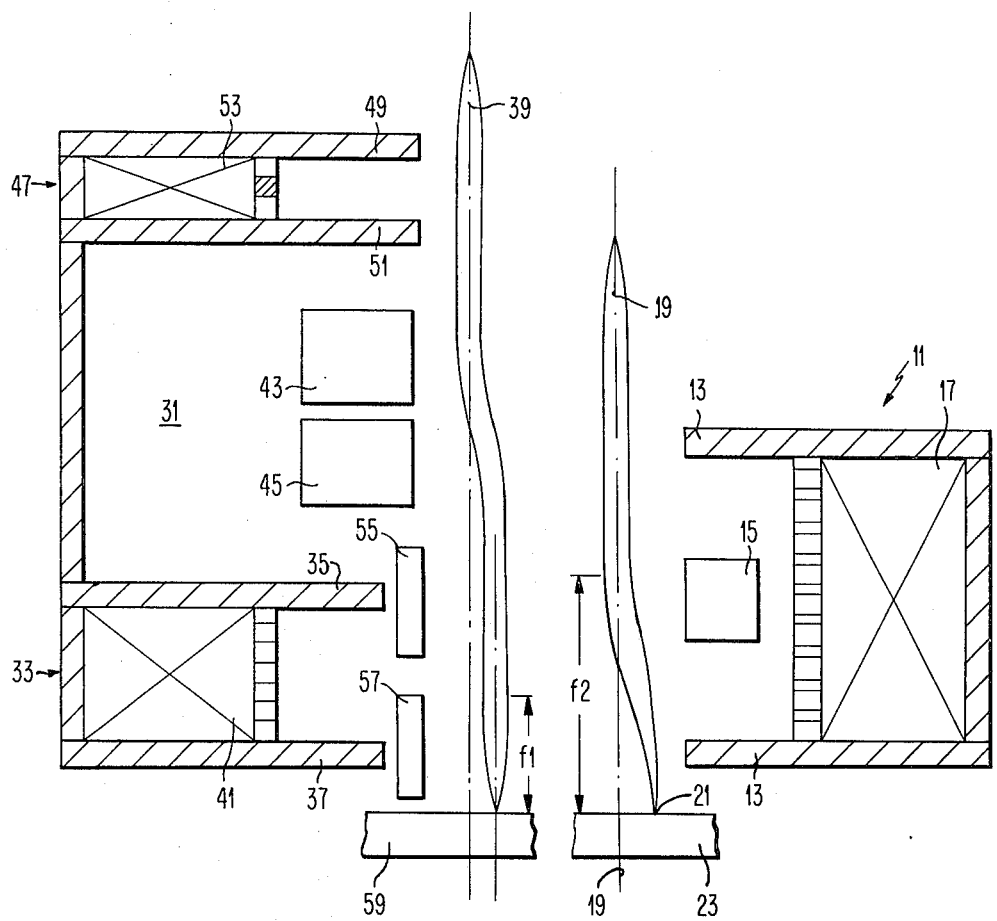
FIG. 1 is a schematic half-sectional drawing illustrating the operation of beam deflection in an electron beam column of the present invention.
FIG. 2 is a schematic half-sectional drawing illustrating the operation of beam deflection in a prior-art electron beam column wherein the deflection is between the pole pieces of the final lens.
Figure 4:
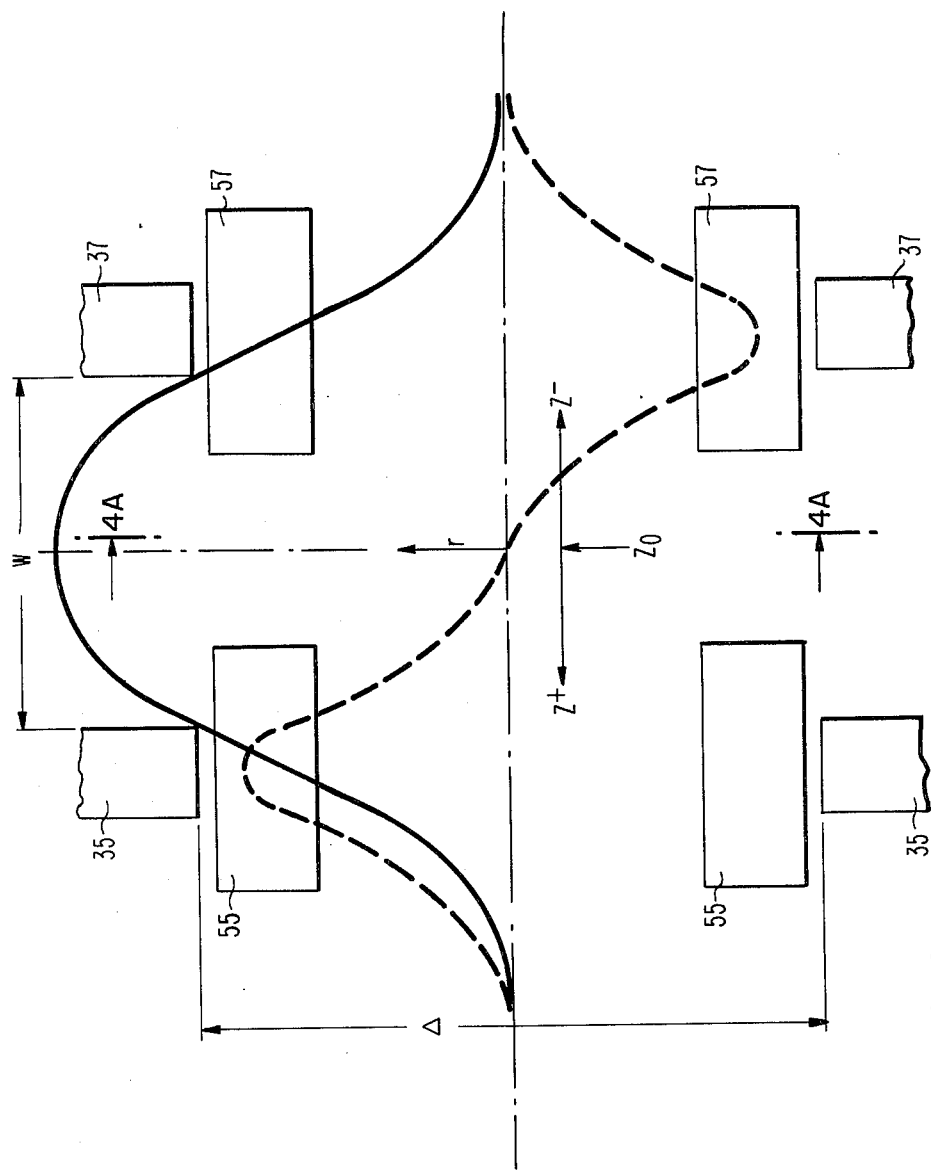
FIG. 4 is a schematic drawing partially broken away illustrating the configuration of a lens pole piece and magnetic compensation yokes and a superposed graphical depiction of the distribution of the magnetic field in the axial direction produced by the pole pieces and of the distribution of the magnetic field orthogonal to the axis produced by the magnetic compensation yokes.
Figure 4A:
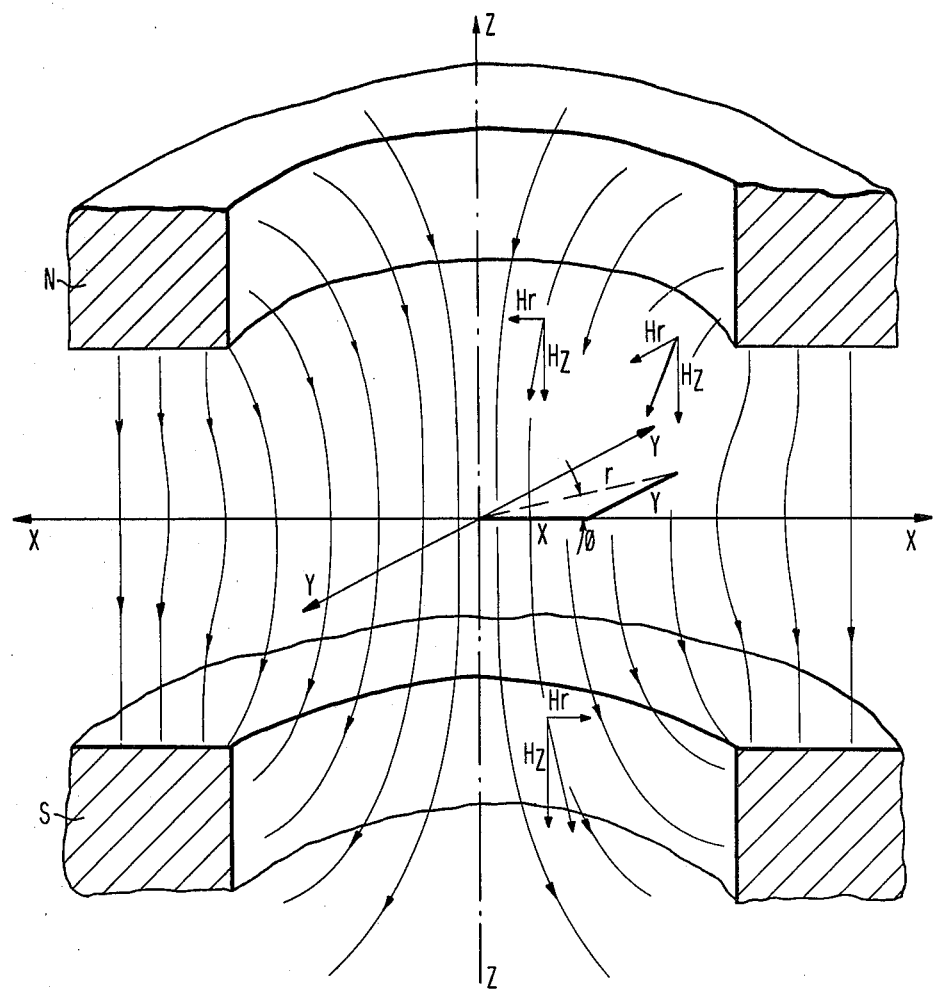
FIG. 4A is a depiction of the magnetic field in a pole piece lens with rotational symmetry showing the pole piece aperture and field lines having rotational symmetry about the electron optical axis together with vectors of the magnetic field strength and its radial component $H_r$ and axial component, $H_z$. Both, a Cartesian (X,Y,Z) coordinate system and a cylindrical (r,θ,z) coordinate system are shown.

Referring to half-section FIG. 2, a schematic drawing is provided illustrating a prior art magnetic lens 11 having pole pieces 13 and a deflection yoke 15 provided between the pole pieces. The magnetic lens of FIG. 2 is described in the aforementioned U.S. Pat. No. 3,930,181 to Pfeiffer. An excitation coil 17 energizes the pole pieces to produce a magnetic field of rotational symmetry. Its maximum strength is within the confines of the pole pieces. The field generated by the magnetic lens has components in the axial and in the radial directions but not in the tangential direction, as depicted in FIG. 4A. On the axis of symmetry the field is in the axial direction only and the field in any radial direction is zero. Potential theory teaches that the magnetic field consisting of an axial component and a radial component is uniquely defined in the entire lens by the distribution, H(z), of the field strength on the axis of symmetry. This distribution has a maximum at or close to the lens center between the pole pieces.

Mathematically, the axial component $H_z(r,z)$ and the radial component $H_r(r,z)$ of the magnetic field strength vector are given at any point with the axial coordinate z and on a circle with radius r by the power series $$H_z(r,z) = H(z) - \frac{1}{4} H''(z)r^2 + \frac{1}{64} H^{(4)}(z)r^4 + O(6) \ldots \text{ and}$$

$$H_r(r,z) = -\frac{1}{2} H'(z)r + \frac{1}{16} H^{(3)}(z)r^3 + O(5) \ldots$$

From these mathematical expressions for the magnetic field strength it follows in particular that the radial component, $H_r(r,z)$ is tied to the derivatives of the distribution H(z) on the symmetry axis. The first term, $-\frac{1}{2}H'(z)r$, dominates near the symmetry axis, where r is small. FIG. 4 depicts a typical distribution of the magnetic field strength on the symmetry axis (solid line) and its first derivative (broken line).

Since the first derivative is zero at the point where the field strength on the symmetry axis given by H(z) has a maximum, the radial component, $H_r(r,z)$ is zero in this plane perpendicular to the symmetry axis at this point. The radial field is directed towards the axis where the field on the axis increases and directed away from the axis where the field on the axis decreases as can be inferred from the negative sign in front of the term $\frac{1}{2}H'(z)r$. FIG. 4A depicts a typical lens field symbolized by magnetic field lines thought to extend from the north pole to the south pole. The axial and radial components are indicated. A Cartesian coordinate system, X, Y, Z, is included to illustrate the relation between the radial component and the orthogonal X- and Y components, to which reference will be made below in connection with the description of a preferred embodiment.

Returning to the description of the prior art lens with an in-the-lens deflection yoke, the electron beam 19 proceeds along the center line of the pole pieces 13 until it comes under the influence of deflection yoke 15. The electron beam 19 is then deflected from the center line to the desired landing point 21 on the target 23. It is readily observed that the electron beam 19 lands at the landing point 21 at an angle and the landing is not perpendicular to the target 23. Also, as the electron beam 19 is deflected from the center line, the electron beam is at a progressively larger distance from the electron optical axis which coincides with the center line. The deflection of electron beam 19 from the electron optical axis results in the generation of aberrations and limits the resolution and field coverage. As can also be seen in FIG. 2, the focal length f2 of the known magnetic lens arrangement having a deflection yoke within the bore of the pole piece, is still relatively long, although shorter than the focal length required by deflection after the lens.

Some prior art designs using a deflection yoke between the pole pieces have also incorporated a second deflection yoke further along the pathway of the electron beam but still between the pole pieces to reduce anisotropic aberrations of the lens. However, such designs have not totally eliminated the deflection aberrations caused by deflecting the electron beam from the electron optical axis. Furthermore, such designs have not provided a perpendicular landing beam.

Referring to half-section FIG. 1, a schematic drawing is provided illustrating a magnetic lens assembly 31 in accordance with the invention. The magnetic lens assembly 31 includes a first magnetic lens 33 having pole pieces 35 and 37. The pole pieces 35 and 37 are circular having a circular aperture for passage of the electron beam 39. An excitation coil 41 activates magnetic lens 33. The electron beam 39 is predeflected by deflection yokes 43 and 45. Deflection yokes 43 and 45, in accordance with usual practice, comprise a plurality of magnetic deflection coils for control of the lateral X and Y deflection of the electron beam.

In a preferred embodiment, a second magnetic lens 47 having pole pieces 49 and 51 and excitation coil 53, is used to provide telecentric capability. The focal length of the second lens is chosen such that the beam leaves this lens as a parallel bundle and the focal length of the first lens is chosen such that this parallel bundle entering this lens is focused in the target plane.

As shown in FIG. 1 the axis of magnetic lens 33 has been shifted to coincide with the shifted center line of the electron beam 39 as it passes through magnetic lens 33. The variable axis lens capability of magnetic lens 33 is provided by first magnetic compensation yoke 55 and second magnetic compensation yoke 57. First and second magnetic compensation yokes 55 and 57 have a predetermined magnetic field which is mathematically related to the magnetic field of magnetic lens 33 in a manner to be described more fully hereinbelow. Compensation yokes 55 and 57 also comprise a plurality of magnetic deflection coils for control of the lateral X and Y shift of the electron optical axis in synchronism with the deflection of the electron beam by deflection yokes 43 and 45.

As further seen in FIG. 1 electron beam 39 is deflected by the deflection yoke 43 from the center line pathway and is redeflected by deflection yoke 45 so as to enter magnetic lens 33 displaced from but parallel to the original center line. The original center line corresponds to the geometric electron optical axis of magnetic lens 33. By shifting the electron optical axis to the deflected position of electron beam 39, off-axis aberrations are eliminated. In particular, the so-called chromatic deflection aberrations are converted into the much smaller so-called axial chromatic lens aberrations. Since the deflected beam 39 enters magnetic lens 33 parallel to the original center line it passes through magnetic lens 33 to the target 59 and lands on target 59 perpendicular to the target. This is a significant advantage of the use of a variable axis lens as described in the present invention. A further advantage of the magnetic lens of the present invention is the relatively short focal length f1 associated with deflection before the lens can be used as shown in FIG. 1.

Referring now to FIGS. 4 and 4A, the principles of operation of the present invention will be more fully explained. FIG. 4 is a schematic diagram showing the pole pieces 35 and 37 of magnetic lens 33 and the first and second magnetic compensation yokes 55 and 57. As is well known, without excitation of magnetic compensation yokes 55 and 57, the magnetic field generated by pole pieces 35 and 37 produces magnetic field lines of rotational symmetry which define a geometrical electron optical axis. The geometrical electron optical axis is usually coincident with the center line extending through the center of the circular apertures in the pole pieces 35 and 37. FIG. 4A depicts a typical distribution of the magnetic field on the symmetry axis.

If the ratio of the width W (gap) between the pole pieces 35 and 37 and the diameter D of the circular aperture in the pole pieces is made small, i.e. less than about 1, the distribution of the magnetic field along the geometrical electron optical axis is approximately Gaussian in shape as shown by the solid line curve in FIG. 4. It should be understood, however, that the electron beam projection system of the invention is not restricted to use of pole piece configurations which result in Gaussian distributions. For example, for W/D greater than 1, the magnetic field distribution has a flat portion between ascending and descending slopes. The first derivative, however, still produces a first peak and a second peak with an intervening constant section, i.e., no change in slope corresponding to the flat portion. In a preferred embodiment of the invention, the compensation yokes are positioned proximate to the first and second peaks, respectively.

When the first magnetic compensation yoke 55 and second magnetic compensation yoke 57 are activated, a magnetic field is generated which is orthogonal to the geometrical electron optical axis. In accordance with the invention, magnetic compensation yokes 55 and 57 are designed to produce a magnetic field distribution which is proportional to the first derivative of the field strength distribution H(z) of the magnetic lens 33 generated by pole pieces 35 and 37. A plot of the first derivative of the field strength distribution of magnetic lens 33 is shown by the dotted line curve in FIG. 4. As shown the first half of the derivative is positive and the second half is negative. Accordingly, the current to second magnetic compensation yoke 57 is the reverse of the current to first magnetic compensation yoke 55. In operation, the X- and Y coils of the magnetic compensation yokes 55 and 57 receive currents proportional to X and Y currents which excite deflection yoke 43 and 45 and generate a magnetic field orthogonal to the geometrical electron optical axis. The distribution along the symmetry axis of this field must be made proportional to the first derivative of the magnetic field on the geometric electron optical axis of the pole pieces. It has been found that this condition can be met by chosing the dimensions of the compensation yokes, namely the lengths and diameters of their coils accordingly either by experiment or computation using computation methods known in the art. The currents sent through the X- and Y- coils of the yokes have a value such that the magnetic deflection field produced is equal to one half the first derivative of the lens field distribution on the symmetry axis multipled by the deflection distance, r, from the axis. The currents $I_x$ and $I_y$ through the X- and Y coils are related through the direction of deflection characterized by the angle $\theta$ (see FIG. 4A) by the equation $$\tan \theta = I_y/I_x.$$

The total field is proportional to $\sqrt{I_x^2 + I_y^2}$.

DESCRIPTION OF A PREFERRED EMBODIMENT

Figure 3:
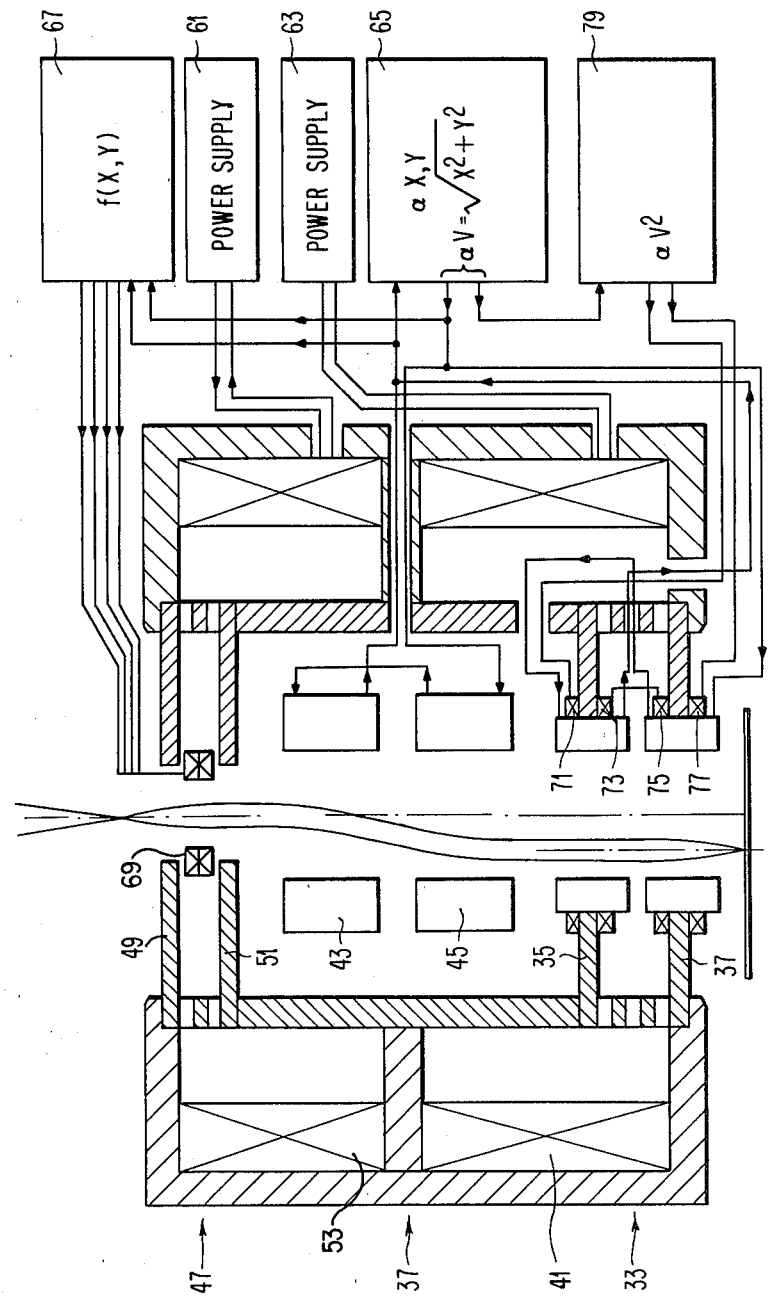
FIG. 3 is a more detailed schematic drawing illustrating the apparatus of the present invention for providing a variable axis lens.

Referring now to FIG. 3, a preferred embodiment of the variable axis projection lens of the present invention which significantly reduces the so-called chromatic and deflection aberration and eliminates coma. Astigmatism and field curvature are corrected using dynamic correction. As shown in FIG. 3, the block 61 is a power supply for excitation coil 53. Block 63 is a power supply for excitation coil 41. Block 65 represents a computer controlled driver for the excitation of deflection yokes 43 and 45. Deflection yokes 43 and 45 have two sets of magnetic deflection coils which cooperate to deflect the electron beam in both an X and a Y direction in accordance with usual practice. Deflection yokes 43 and 45 are usually comprised of a plurality of toroidal coils. Driver 65 also acts to activate magnetic compensation yokes 55 and 57 which also consist of a pair of X-Y magnetic deflection coils. Magnetic compensation yokes 55 and 57 may comprise simple saddle coils because of their smaller outer diameter for the same inner diameter as compared to a toroidal yoke of the same deflection sensitivity. The X-Y currents sent to magnetic compensation yokes 55 and 57 is proportional to the X-Y currents sent to deflection yokes 43 and 45 and may be supplied by the same driver block 65.

In the first approximation the field of the compensation yokes compensates the radial component of the lens field along a line parallel to the symmetry axis of the lens and having a distance proportional to the current into the compensation yokes. This line represents the shifted electron optical axis because the radial component of the field has become zero there.

Figure 6:
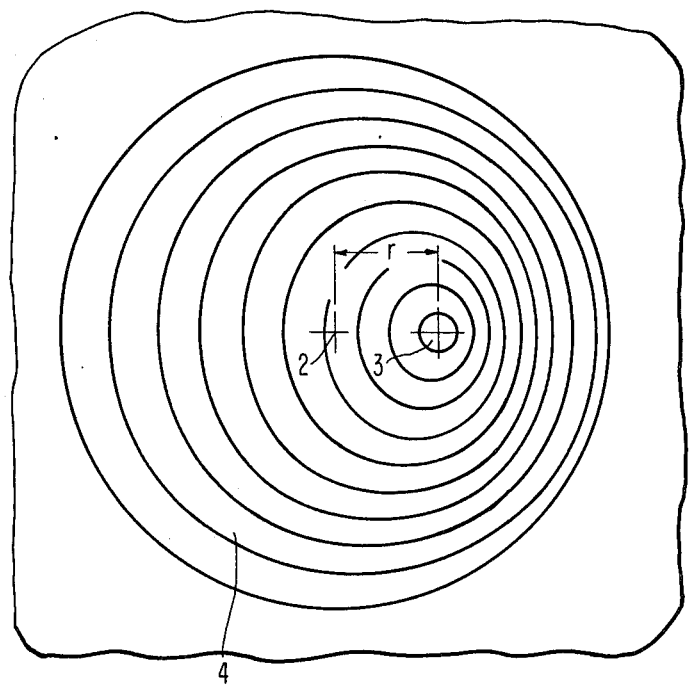
FIG. 6 is a cross-sectional view through the lens showing lines of equal scalar magnetic potential generated by shifting of the electron optical axis in accordance with the invention.

Referring to FIG. 6, it can be seen that the shift of the electron optical axis from the geometric electron optical axis 2 to position 3 results in a distortion of the rotational symmetry of the magnetic field lines 4 to a small extent. Without compensation, the slight distortion of the rotational symmetry would result in an astigmatic aberration. A dynamic correction coil assembly 69, preferably a dual quadrapole element, is provided to compensate for the astigmatic aberration. The block 67 represents a driver for the excitation of the dynamic astigmatism correction coil 69. This driver receives an input signal proportional to the currents which are sent to the X and Y deflection yokes 43 and 45 and generates a signal which is a function of the input in a known manner.

Figure 5:
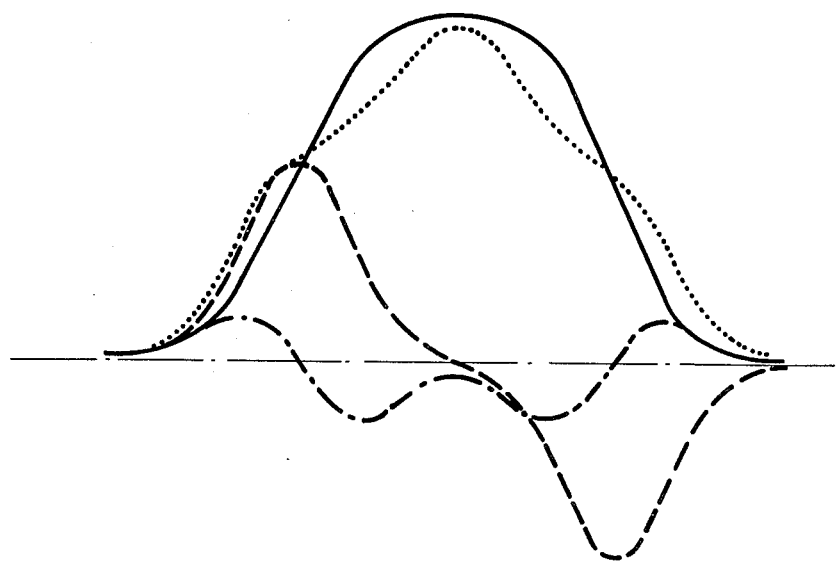
FIG. 5 is a graph depicting the distribution of the magnetic field strength on the symmetry axis (solid line) of a typical axially symmetrical pole piece lens; its first derivative (dashed line), which is at the same time the distribution of the zero order of the deflection field of the compensation yoke; the compensated distribution of the axial component of the superimposed lens and the deflection fields of the compensation yokes along the shifted axis (dotted line), and the distribution of the axial component of the dynamic focus correction coil on the geometrical symmetry axis (dot and dash line).

In FIG. 5, the magnetic field strength distribution on the shifted vertical axis of magnetic lens 33 is shown by the dotted line curve. The ideal field strength distribution is shown by the solid line curve. The resulting field strength distribution along the new (shifted) electron optical axis is shown as a dotted curve in FIG. 5. The deviations from the solid (ideal) curve shown by the dotted curve are grossly exaggerated. This field is weaker than that on the optical axis and is preferably increased by a dynamic power correction coil. The deviation from ideal of the field strength distribution on the shifted axis is a second order function. It has been determined that this deviation can be corrected by providing additional dynamic correction coils which have a field strength proportional to the second derivative of the magnetic field strength distribution on the shifted axis. The first derivative of the original field is shown by the dashed line curve in FIG. 5. The second derivative is shown by the dash-dot line curve of FIG. 5. As can be seen in FIG. 5, the second derivative has four extrema with alternating positive and negative values. The apparatus in FIG. 3 is provided with dynamic focus correction coils 71, 73, 75 and 77. Each of the dynamic focus correction coils provides a magnetic field whose distribution on the shifted axis is proportional to a portion of the second derivative of the field strength distribution of the lens on the shifted axis. The block 79 represents a driver for the excitation of the dynamic focus correction coils 71, 73, 75 and 77. This driver receives an input signal which is proportional to r, the deflection distance of the shifted axis, and generates a signal proportional to $r^2$.

EXAMPLE

The magnetic field of a pole piece lens to be used in an electron beam column was measured along its axis with a magnetic field probe. The magnetic field distribution obtained was differentiated. The general shape of the magnetic field of the pole piece lens and the first derivative of the curve was as generally shown in FIG. 4.

Two saddle yokes for use as magnetic compensation yokes were then fabricated. The magnetic field distribution of the saddle yokes was calculated using well known mathematical expressions for calculation of magnetic field distributions as set forth in the literature, for example, E. Munro, Design and Optimization of Magnetic Lenses and Deflection Systems for Electron Beams, J. Vac.-Science Technol. Vol. 12, No. 6 November/December 1975, pp. 1146-1150. Proposed physical dimensions of the saddle yokes were systematically varied by computer simulation and the magnetic field distribution was recalculated with each variation, until the calculated field distribution of a saddle yoke computer model approximately matched the first derivative of the magnetic field distribution of the pole piece lens. Saddle yokes were then fabricated in accordance with the calculated dimensions and the magnetic field of the fabricated saddle yokes was measured with a magnetic field probe when the saddle yokes were positioned inside the pole pieces. An optimum position and orientation was determined by trial and error.

Figure 7:
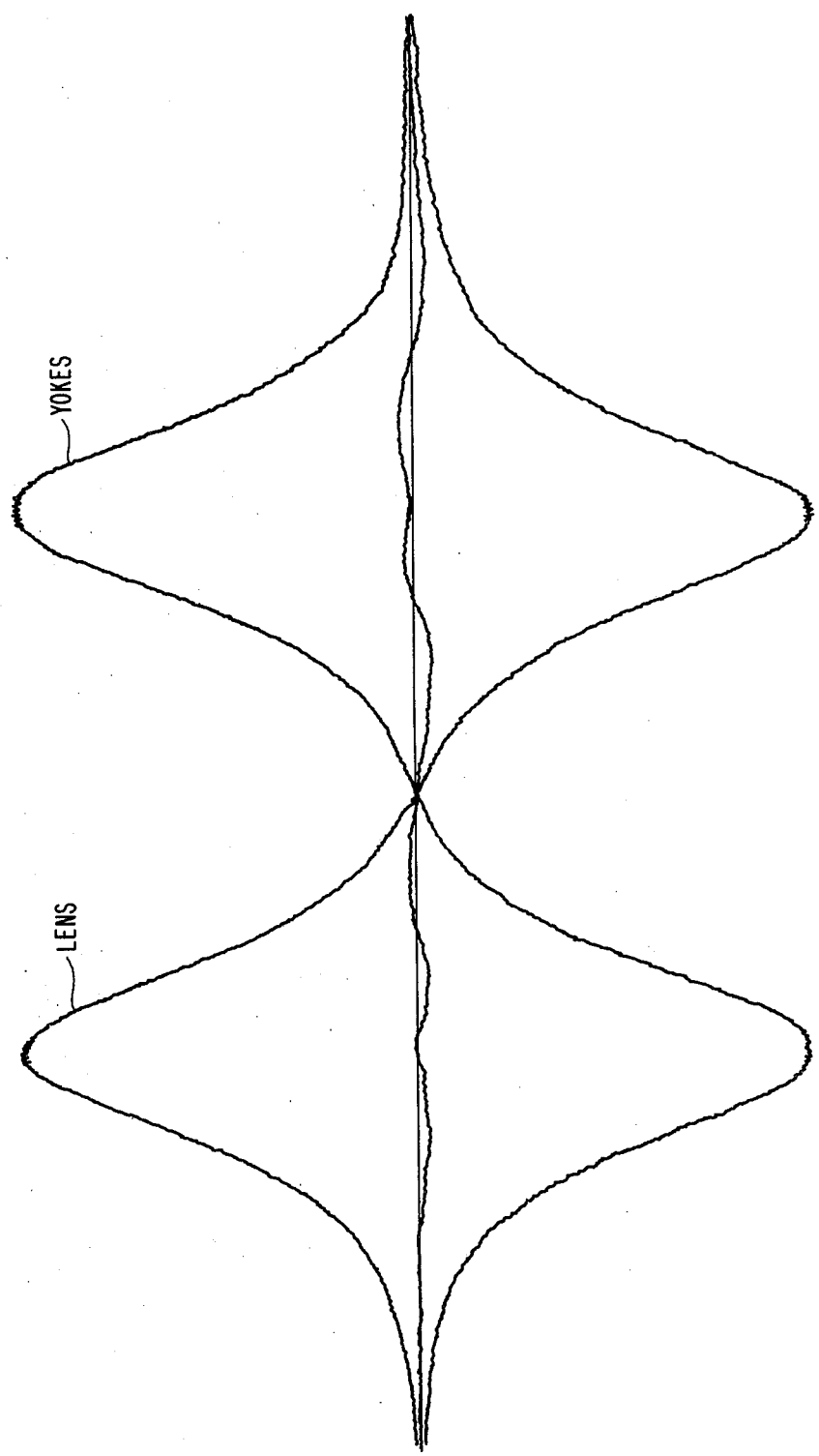
FIG. 7 is a graphical trace of the measured magnetic field of a pole piece lens, its first derivative and the magnetic field of compensation yokes positioned within the lens.

As shown in FIG. 7, an actual measurement of the magnetic field of the pole piece lens is shown. Also shown is the derivative of the axial magnetic field distribution and the actual magnetic field of the fabricated saddle yoke. By adjusting the current through the saddle yoke to a suitable value, both curves matched very closely so as to satisfy the condition of shifting of the electron optical axis of the lens. The difference of the two curves is also shown in FIG. 7. The difference should ideally amount to zero and the difference actually obtained, as shown, is small compared to the magnitude of the magnetic field.

The pole piece lens with the compensation saddle yokes in place was used in an electron beam column to image a square aperture onto a target plane. The current density distribution across the image in the target plane was measured by conventional scanning methods and displayed on an oscilloscope. An ideal current distribution would approximate a square wave. In practice, however, aberrations are always present which result in an edge slope of finite steepness. Defocusing of the electron beam by change in the electron acceleration voltage supplied also causes a reduction in edge slope steepness. The position of the image in the target plane can also be monitored by the scanning method.

The effect of shifting the electron beam from the optical axis of a pole piece lens, without the use of compensation yokes in accordance with the invention, is first considered for comparison.

FIG. 8A depicts schematically a pole piece lens with pole pieces 105 and 107 with an axis of symmetry 109, entered by an electron beam 111 parallel to the axis, but displaced from the axis by a significant amount. The lens will focus the electrons at the optical axis of the lens for a particular energy velocity, namely the one corresponding to the acceleration voltage of the electron gun. In the actual example used this acceleration voltage was 25,000 volts. For these electrons, the image is focused at the intersection of the electron optical axis, 109, and the target plane 110, at position 113. The trace of the current density distribution at this position is indicated by the curve 119 shown below the schematic representation of the electron beam trace.

While the electron beam is focused at the indicated voltage, aberrations, such as spherical aberration and coma, are large, due to the off-axis entry of the beam into the lens, and cause edge slope deterioration. If the velocity of electrons is changed, by variation of the electron beam voltage, the beam is no longer focused on the target plane and the position of the defocused image moves away from the intersection of the axis and the target, 113. Slower electrons are focused closer to the lens as shown at position 115. The trace of the current density distribution that appears on the oscilloscope has the shape schematically indicated by the curve 121. Faster electrons are focused below the target plane at position 117. The trace of the current density distribution in the target plane for this defocused image is indicated schematically by the curve 123. Both traces for the electron beam of changed velocity not only show a strongly deteriorated edge slope but are significantly displaced from the electron optical axis.

In the variable axis pole piece lens with pole pieces 125 and 127 and compensation yokes 129 and 131 according to the present invention, the electron optical axis is shifted from axis of symmetry 133 to the center of the entering electron beam 135, as shown in FIG. 8B. For focused electrons of nominal velocity, corresponding to an acceleration voltage of 25,000 volts, the electron beam is focused in the target plane at the position where the shifted axis intersects the target plane, as shown at position 137. The current density distribution as shown on the oscilloscope is schematically shown as the curve 143. Since aberrations, such as spherical aberration and coma, are much smaller on and close to the electron optical axis, the edge slope of curve 143 is much steeper than the edge slope of the curve 119 for a pole piece lens not equipped with compensation yokes according to the invention. Electrons of different velocity are again focused above or below the target plane as shown in FIG. 8B. The focus point 139 indicates the focus for slower electrons and the focus point 141 indicates the focus for faster electrons. The defocused images, however, are not moved away from the electron optical axis but remain at the intersection of the shifted electron optical axis and the target plane. The current density distribution traces for the three cases are schematically shown by the curves 143, 145 and 147, respectively.

Changes in electron beam energy still cause defocusing as a result of axial chromatic aberration. Elimination of lateral movement however, shows complete compensation for movement of the transverse radial chromatic aberration typically associated with off-axis beam positions. This demonstrates that the beam is still on-axis. The variable axis of the lens remains in coincidence with the shifted axis of the electron beam.

Figure 9:
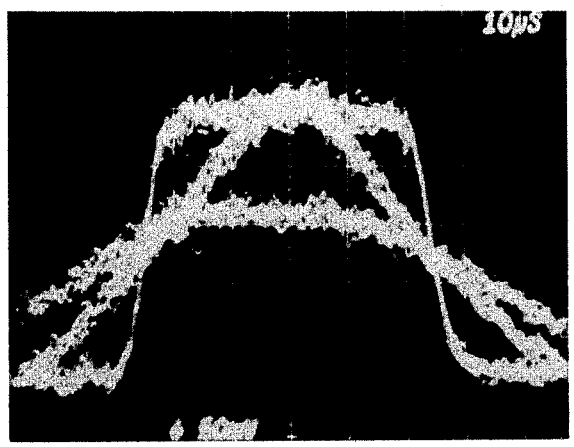
FIG. 9 is a photograph of an oscilloscope trace of the spot shapes of deflected electron beams of different energies which have been focused by the pole piece lens of the present invention.

FIG. 9 shows an actual oscilloscope trace of the current density distribution in the target plane obtained using the pole piece lens with compensation yokes in accordance with the invention. By application of suitable current to the compensation yokes, the electron optical axis was shifted into the center of the entering electron beam which was displaced 5 mm from the geometrical axis of symmetry. The acceleration voltage of the beam was then changed from 25,000 volts (optimum focus and steepest edge slopes) by ±11 volts and by ±32 volts. This resulted in traces of defocused images. The defocused images are, however, not axially displaced from the trace of the focused image for electrons having an acceleration voltage corresponding to 25,000 volts. This experimental result obtained with a particular embodiment of the invention demonstrates that the electron optical axis has actually been shifted.

The effect of the shifted axis regarding electrons of different velocity is particularly important in that positional change blurring associated with electrons having a broad velocity spectrum in focusing and deflection systems are a dominant performance limitation, particularly in high throughput electron beam lithography tools. Energy spreads in the beam of greater than ±4 electron volts are not usually encountered in electron beam tools. This is a fraction of the range in variation of electron beam energy used to demonstrate the performance of the pole piece lens of the invention. Since the electron beam enters the pole piece lens on the electron optical axis, coma is eliminated. Astigmatism and defocusing caused by changes in the strength of the lens field due to the superimposed deflection field along the shifted electron optical axis are corrected by astigmator coils and dynamic focus coils as previously described.

While the invention has been particularly shown and described with reference to a preferred embodiment thereof, it will be understood by those skilled in the art that various changes in form and details may be made without departing from the spirit and scope of the invention.

What is claimed is:

1. An electron beam projection system having a projection lens arranged so that upon predeflection of the electron beam the electron optical axis of the lens shifts to be coincident with said deflected beam comprising
   electron beam producing means for producing an electron beam,
   deflection means for deflecting said beam,
   magnetic projection lens means having rotational symmetry for focusing said deflected beam;
   and a pair of magnetic compensation yoke means positioned within the bore of said lens means, said pair of compensation yoke means having coil dimensions such that, in combination, they produce a magnetic compensation field proportional to the first derivative of the axial magnetic field strength distribution curve of said lens means and cause the electron optical axis of said lens means to shift to the position of said deflected beam, so that said electron beam remains coincident with said shifted electron optical axis and lands perpendicular to a target.

2. An electron beam projection system in accordance with claim 1 wherein the first of said pair of magnetic compensation yoke means is located proximate to the first peak of a first derivative of said axial magnetic field strength distribution curve of said lens means and the second of said pair of magnetic compensation yoke means is located proximate to the second peak of a first derivative of said axial magnetic field strength distribution curve of said lens means.

3. An electron beam projection system in accordance with claim 1 or claim 2 wherein said electron optical axis of said lens means shifts in synchronism with the deflection of said electron beam.

4. An electron beam projection system in accordance with claim 1 or claim 2 wherein said axial magnetic field strength distribution curve of said lens means corresponds approximately to a Gaussian distribution.

5. An electron beam projection system in accordance with claim 1 or claim 2 wherein a dynamic correction coil compensates for distortion of astigmatism due to the rotational symmetry caused by the shift of the electron optical axis of said lens means to be coincident with said deflected electron beam.

6. An electron beam projection system in accordance with claim 1 which further includes dynamic focus correction coils which compensate for second order errors proportional to the second derivative of the axial magnetic field strength distribution of said lens means.

7. An electron beam projection system in accordance with claim 6 wherein said dynamic focus correction coils are driven by a current proportional to the square of the beam deflection distance from the symmetry axis.

8. In an electron beam column:
   a projection lens including pole piece means to produce magnetic field lines of rotational symmetry defining a geometrical electron optical axis, said field lines having a magnetic field strength distribution curve along said axis,
   first magnetic compensation yoke means positioned within the upper portion of the bore of said pole piece means;
   and second magnetic compensation yoke means positioned within the lower portion of the bore of said pole piece means;
   said first and second magnetic compensation yoke means in combination having a magnetic field distribution proportional to the first derivative of said axial magnetic field strength distribution of said projection lens which field distribution causes the electron optical axis of said pole piece means to shift upon application of current to said compensation yokes.

9. In the electron beam column of claim 8 wherein said first magnetic compensation yoke means is located proximate to the first peak of a first derivative of said axial magnetic field strength distribution curve of said pole piece means and said second magnetic yoke means is located proximate to a second peak of a first derivative of said magnetic field strength distribution curve of said pole piece means.

10. In the electron beam column of claims 8 or 9 wherein said electron optical axis of said pole piece means shifts in synchronism with the position of said deflected beam.

11. In the electron beam column of claims 8 or 9 wherein said axial magnetic field strength distribution curve of said pole piece means corresponds approximately to a Gaussian distribution.

12. In the electron beam column of claims 8 or 9 including dynamic correction coil means to compensate for distortion of rotational symmetry caused by the shift of the electron optical axis to be coincident with said deflected electron beam.

13. In the electron beam column of claim 8 further including dynamic focus correction coil means to compensate for second order errors proportional to the second derivative of the axial magnetic field strength distribution on the shifted axis of said pole piece means.

14. In the electron beam column of claim 13 wherein said dynamic focus correction coils are driven by a current proportional to the square of the beam deflection distance from the shifted axis.

* * * * *